(12) United States Patent
Payne (10) Patent No.: US 9,496,868 B2
(45) Date of Patent: Nov. 15, 2016

(54) PIVOTING CAPACITIVE TOUCH SENSE ASSEMBLY

(71) Applicant: Verizon Patent and Licensing Inc., Basking Ridge, NJ (US)

(72) Inventor: David G. Payne, Aloha, OR (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 55 days.

(21) Appl. No.: 14/034,065

(22) Filed: Sep. 23, 2013

(65) Prior Publication Data

US 2015/0084910 A1    Mar. 26, 2015

(51) Int. Cl.

| | |
|---|---|
| *G06F 3/033* | (2013.01) |
| *H03K 17/96* | (2006.01) |
| *G06F 3/044* | (2006.01) |
| *H03K 17/98* | (2006.01) |

(52) U.S. Cl.
CPC ............. *H03K 17/962* (2013.01); *G06F 3/044* (2013.01); *H03K 17/98* (2013.01); *H03K 2217/96066* (2013.01); *H03K 2217/960755* (2013.01)

(58) Field of Classification Search
CPC ........ G06F 3/011; G06F 3/017; G06F 3/016; G06F 3/0338
USPC .................. 345/156, 173, 174, 161; 200/600
See application file for complete search history.

(56) References Cited

U.S. PATENT DOCUMENTS

| | | | | |
|---|---|---|---|---|
| 6,337,678 | B1 * | 1/2002 | Fish ............................... | 345/156 |
| 7,774,155 | B2 * | 8/2010 | Sato et al. .................... | 702/127 |
| 2002/0033795 | A1 * | 3/2002 | Shahoian et al. ............. | 345/156 |
| 2004/0155863 | A1 * | 8/2004 | Sakamaki et al. ............. | 345/156 |
| 2004/0233159 | A1 * | 11/2004 | Badarneh ....................... | 345/156 |
| 2009/0207040 | A1 * | 8/2009 | Nakamura ............... | 340/825.69 |
| 2010/0149111 | A1 * | 6/2010 | Olien ............................ | 345/173 |
| 2010/0182263 | A1 * | 7/2010 | Aunio et al. .................. | 345/173 |

\* cited by examiner

*Primary Examiner* — Calvin C Ma (57) ABSTRACT

Apparatuses, methods and storage medium associated with providing use input are disclosed herein. In embodiments, an apparatus may include a capacitive touch sense module having a center region and a plurality of arms extending away from the center region in a plurality of directions. The arms may include a first arm extending away from the center region in a first direction, and a second arm extending away from the center region in a second direction opposite to the first direction. The apparatus may further include one or more pairs of springs, including a first pair of springs disposed at respective edges of an undersurface of the first and second arms to allow the capacitive touch sense module to pivot between the first and second directions. Other embodiments may be described and/or claimed.

20 Claims, 5 Drawing Sheets

PIVOTING CAPACITIVE TOUCH SENSE ASSEMBLY

TECHNICAL FIELD

The present disclosure relates to the field of user input devices, in particular, to apparatuses, methods and storage medium associated with a remote control having a pivoting capacitive touch sense assembly.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Touchpads have been widely employed as pointing devices for computing for some time. Today, they are also increasingly being used in smartphones, as well as remote controls for controlling media consumption devices, such as televisions or set-top boxes. Conventional touchpads typically include a tactile sensor, a specialized surface that translates the motion and position of a user's fingers to a relative position on screens. Conventional touchpads typically operate in one of several ways, including capacitive sense or conductance sense. Conventional touchpads typically do not provide tactile feedback to the users.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Apparatuses, methods and storage medium associated with providing use input are disclosed herein. In embodiments, an apparatus, e.g., a remote control, may include a capacitive touch sense module having a center region and a plurality of arms extending away from the center region in a plurality of directions. The arms may include a first arm extending away from the center region in a first direction, e.g., the +X direction, and a second arm extending away from the center region in a second direction opposite to the first direction, e.g., the −X direction. The apparatus may further include one or more pairs of springs, including a first pair of springs disposed at respective edges of the undersurface of the first and second arms to allow the capacitive touch sense module to pivot between the first and second directions. In embodiments, the first and second arms may be configured to pivot between the first and second directions to increase or decrease a volume of a media consumption device controlled by the remote control, or to move up or move down a current channel of the media consumption device.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
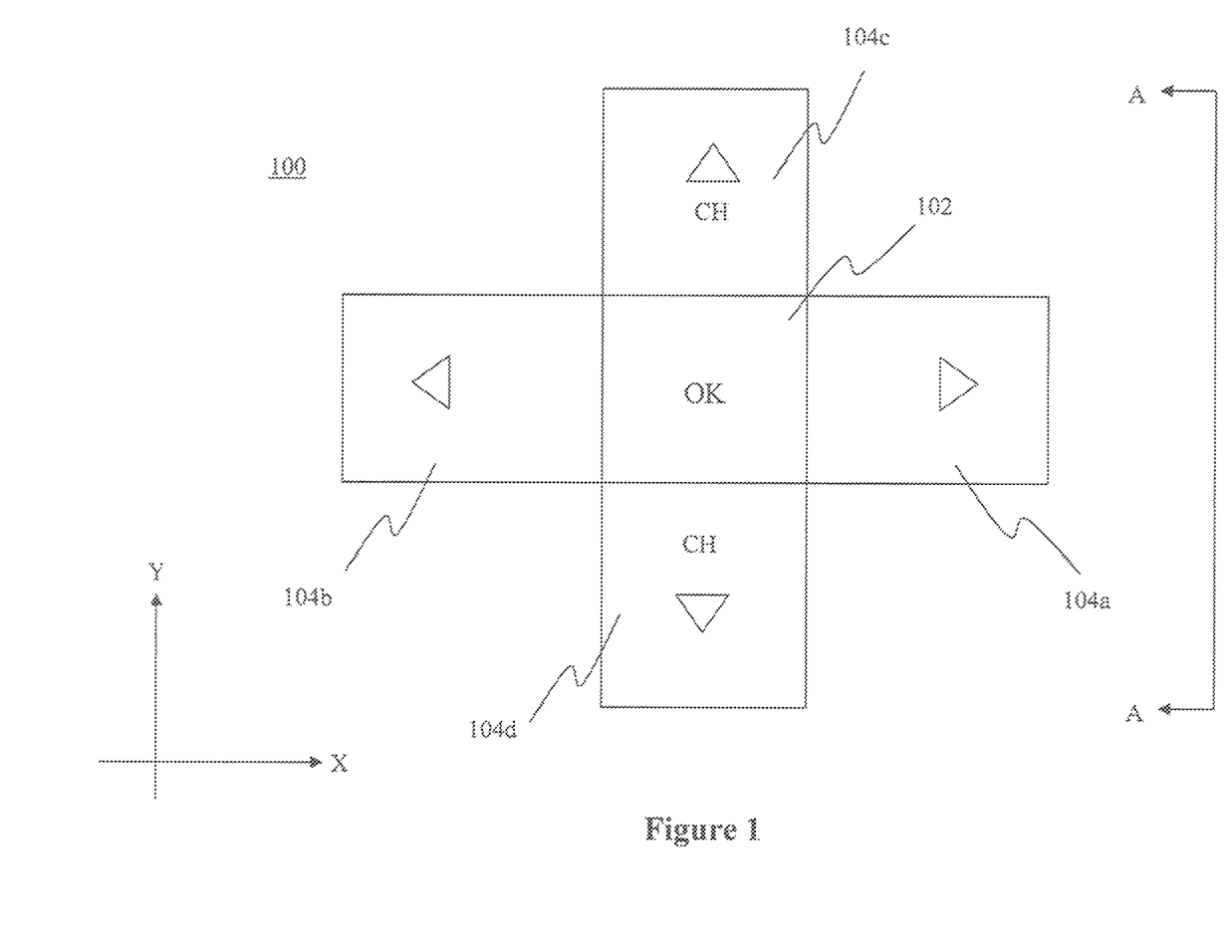
FIG. 1 illustrates a top view of a pivoting capacitive touch sense assembly of the present disclosure, in accordance with various embodiments.
Figure 2:
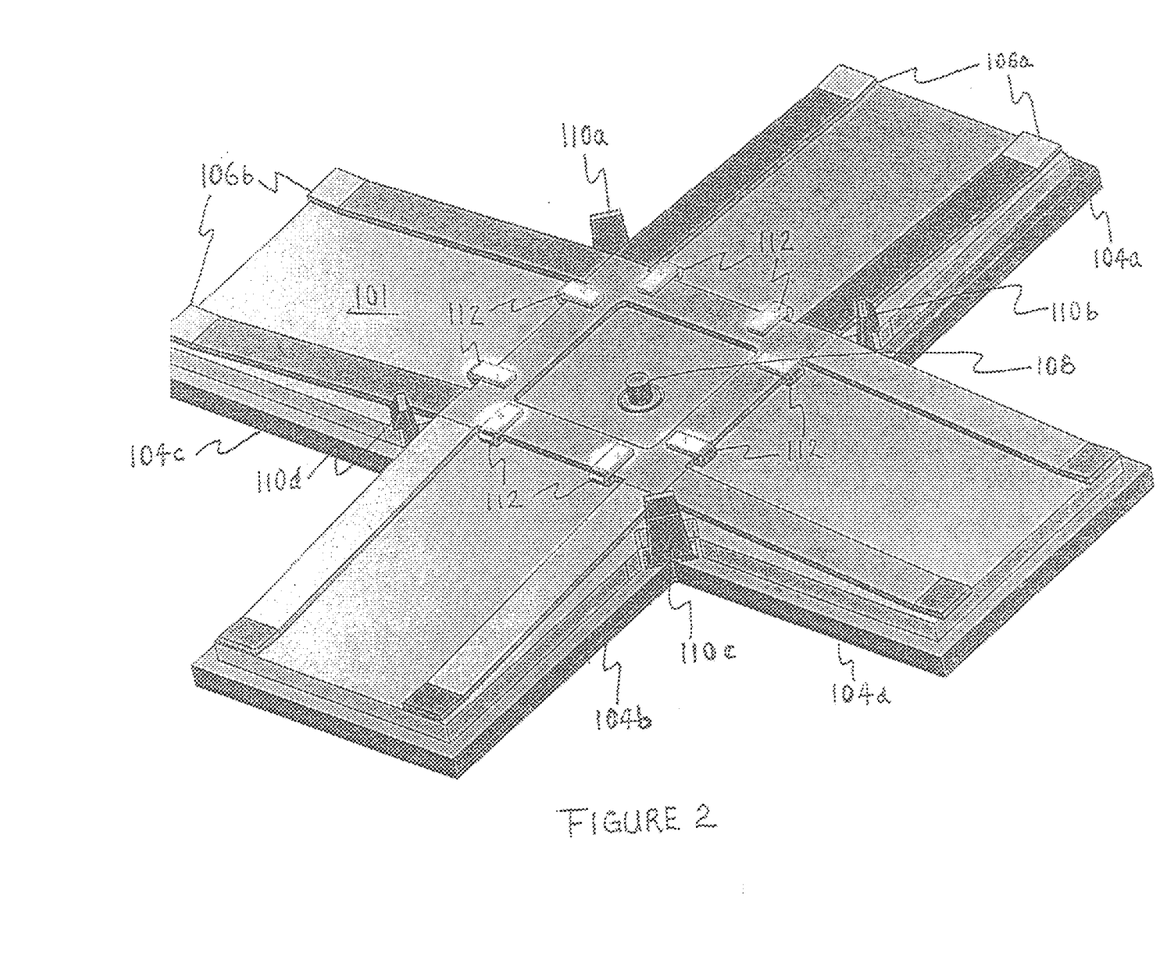
FIG. 2 illustrates a bottom perspective view of the pivoting capacitive touch sense assembly, in accordance with various embodiments.
Figure 3:
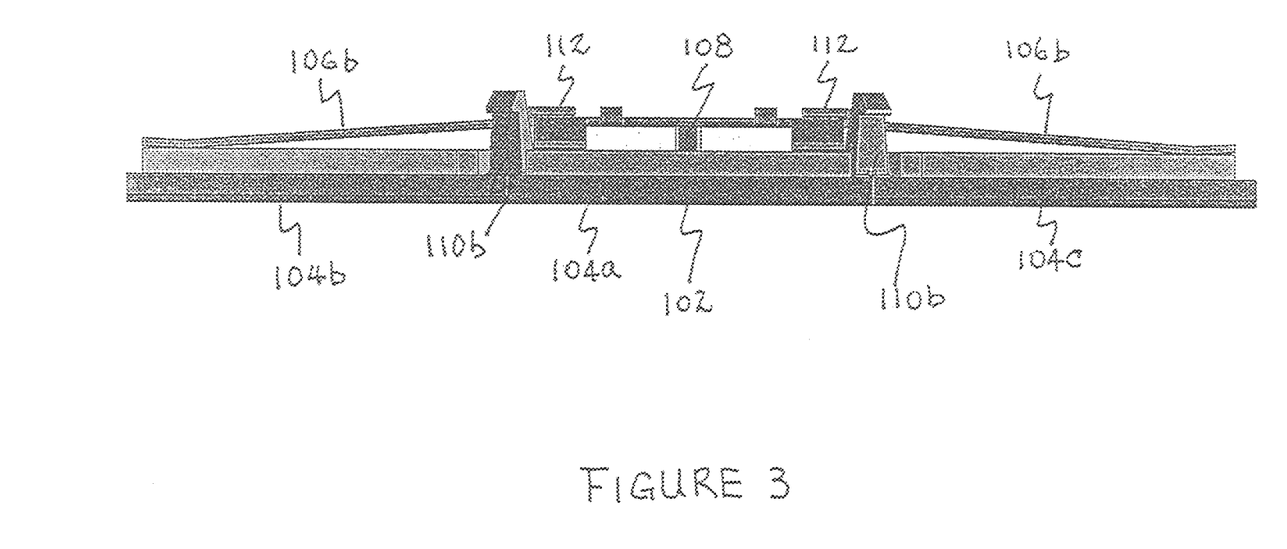
FIG. 3 illustrates a side view of the pivoting capacitive touch sense assembly, in accordance with various embodiments.

Referring now FIGS. 1-3, wherein a top view, a bottom perspective view, and a side view of a pivoting capacitive touch sense assembly, in accordance with various embodiments, are illustrated. The side view of FIG. 3 is pivoting capacitive touch sense assembly 100 of FIG. 1, as viewed from view line A-A. As shown in FIGS. 1 and 2, in embodiments, pivoting capacitive touch sense assembly 100 may include pivoting capacitive touch sense module 101 having a center region 102, and a number of arms 104a-104d extending away from center region 102. The number of arms 104a-104d may include arm 104a, arm 104b, arm 104c and arm 104d. Arm 104a may extend in a first direction, e.g., +X direction, with arm 104b extending in a second direction that is opposite to the first direction, e.g., −X direction. Further, arm 104c may extend in a third direction that is orthogonal to the first and second directions, e.g. +Y direction. Arm 104d may extend in a fourth direction that is opposite to the third direction, e.g. −Y direction.

Additionally, as shown in FIGS. 2 and 3, pivoting capacitive touch sense assembly 100 may include one or more pairs of springs 106a and 106b. The one or more pairs of springs 106a and 106b may include a first pair 106a disposed at respective edges of the undersurface of arms 104a and 104b to enable arms 104a and 104b to pivot between the first and second directions, e.g., +X to −X directions. The one or more pairs of springs 106a and 106b may further include a second pair of springs 106b disposed at respective edges of the undersurface of arms 104c and 104d to enable arms 104c and 104d to pivot between the third and fourth directions, e.g., +Y to −Y directions.

In embodiments where pivoting capacitive touch sense assembly 100 is incorporated in a remote control, the pivoted position of arms 104a and 104b may be employed to indicate an increase or decrease of a media consumption device, such as television or set-top box controlled by the remote control. The pivoted position of arms 104c and 104d may be employed to indicate move up or move down of a current channel of the media consumption device.

Further, as shown in FIGS. 2-3, pivoting capacitive touch sense assembly 100 may include a stem 108 extending from a center point of center region 102 in a direction that is orthogonal to the undersurface of pivoting capacitive touch sense module 101. Stem 108 may be dimensioned such that it will activate a switch on a printed circuit board, to which pivoting capacitive touch sense assembly 100 is mounted, when pivoting capacitive touch sense assembly 100 is pressed towards the printed circuit board.

To facilitate mechanically mounting pivoting capacitive touch sense assembly 100 with a printed circuit board, as shown in FIGS. 2 and 3, pivoting capacitive touch sense assembly 100 may include a number of snaps 110a-110d. In particular, for the cross shaped embodiments with four extending arms 104a-104d, the number of snaps 110a-110d may include snap 110a disposed at a corner where arm 104a meets arm 104c, snap 110b disposed at a corner where arm 104a meets arm 104d, snap 110c disposed at a corner where arm 104c meets arm 104b, and snap 110d disposed at a corner where arm 104b meets arm 104c.

To facilitate electrically coupling pivoting capacitive touch sense module 101 with a printed circuit board, pivoting capacitive touch sense assembly 100 may also include a number of bonding pads 112 disposed at the undersurface perimeter of center region 102 of pivoting capacitive touch sense module 101.

In embodiments, except for its shape and dimensions, electronically, pivoting capacitive touch sense module 101 may be constituted with any one of a number of electrode/sensor arrangements known in the art. Arms 104a-104d of cross shaped pivoting capacitive touch sense module 101 may have respective linear dimensions in the range of 50 mm. For these embodiments, each spring of each pair of springs 106a and 106b may have a linear dimension in the range of 25 mm. Each spring may have a spring force in the range of 250 grams, constituted with any one of a wide range of metallic materials. Stem 108 may be cylindrical in shape and has a diameter in the range of 3 mm, and a height in the range of 5 mm.

Figure 4:
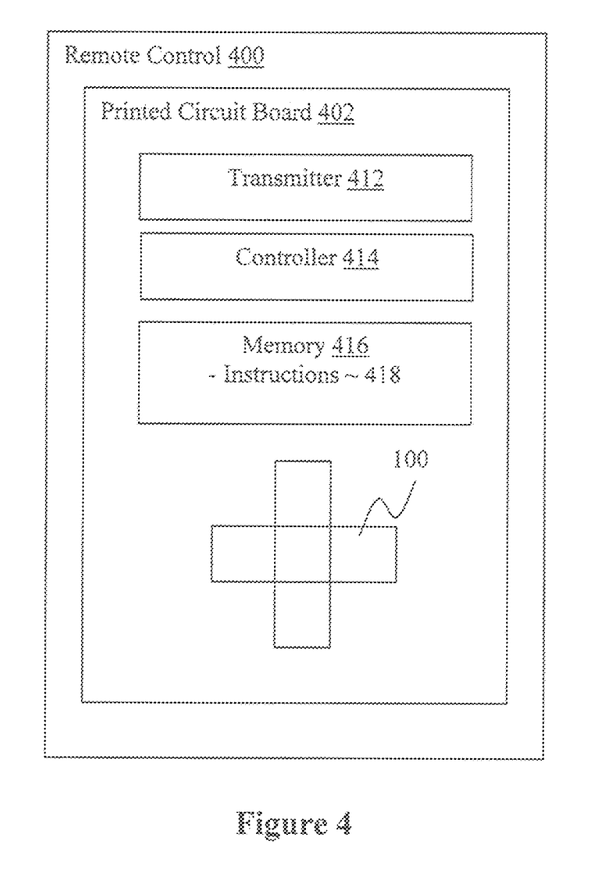
FIG. 4 illustrates a component view of an example remote control incorporated with the pivoting capacitive touch sense assembly of FIGS. 1-3, in accordance with various embodiments.

Referring now to FIG. 4, wherein a component view of an example remote control incorporated with pivoting capacitive touch sense assembly 100 of the present disclosure, in accordance with various embodiments, is shown. As illustrated, example remote control 400 may include printed circuit board 402. Further, example remote control 400 may include transmitter 412, controller 414, memory 416 and pivoting capacitive touch sense assembly 100, mounted on printed circuit board 402. Memory 416 may include instructions 418. The example embodiments are meant to be illustrative, not limiting. In alternate embodiments, other remote controls, or other devices incorporated with pivoting capacitive touch sense assembly 100, these other remote controls or other devices may include more or less components.

For the embodiments, transmitter 412 may be configured to transmit control signals to a media consumption device controlled by remote control 400. The control signals may include among other things, pivoted position of pivoting capacitive touch sense assembly 100. As described earlier, example media consumption devices may include, but are not limited to, televisions, set-top boxes and so forth. Transmitter 412 may be any one of a number of electromagnetic or infrared wireless transmitters known in the art. Example of electromagnetic wireless transmitters may include, but are not limited to, Bluetooth® or WiFi transmitters.

Controller 414 may be configured to control operation of remote control 400, in particular, components of remote control 400. Controller 414 may control operation of remote control 400 via execution of instructions 418. Controller 414 may be any one of a number microcontrollers and/or microprocessors known in the art.

Memory 416 may include volatile and non-volatile memory configured to store working and/or permanent copies of instructions 418, as well as configuration and operational data of remote control 400. Example volatile memory may include, but is not limited to, dynamic random access memory (DRAM). Example non-volatile memory may include, but is not limited to, flash or solid state memories.

Instructions 418 may be configured to implement the logic to practice, e.g., method 500 of FIG. 5, to be described in more detail below. Instructions 418 may comprise native instructions of the instruction set architecture (ISA) of controller 414 or high level language instructions with compiler support to compile the instructions into instructions of the ISA of controller 414. In embodiments, in addition to being embodied in computer-readable non-transitory medium, such as non-volatile or volatile memory, instructions 418 may be embodied (encoded) in computer-readable transitory medium, such as, signals.

Figure 5:
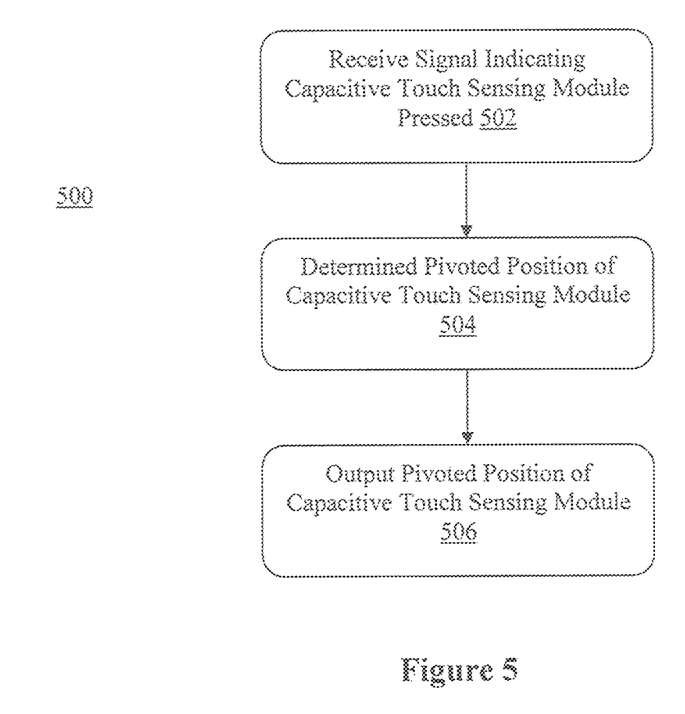
FIG. 5 illustrates an example method for providing user input using the capacitive touch sense assembly of FIGS. 1-3, in accordance with various embodiments.

Referring now to FIG. 5, wherein a method for providing use input, using pivoting capacitive touch sense assembly 100 of the present disclosure, in accordance with various embodiments, is shown. As described earlier, method 500 may, e.g., be practiced by remote control 400, in response to execution of instructions 418 configured to implement method 500. In alternate embodiments, method 500 may be implemented in hardware or combination of hardware/software. Example hardware implementations may include Application Specific Integrated Circuit (ASIC) or programmable integrated circuit, such as, Field Programmable Gate Arrays (FPGA) programmed with logic to perform the operations of method 500.

As illustrated, method 500 may begin at block 502 where a signal indicative of pivoting capacitive touch sense assembly 100 having been pressed, may be received. From block 502, method 500 may proceed to block 504. At block 504, method 500 may determine the pivoted position of pivoting capacitive touch sense assembly 100. From block 504, method 500 may proceed to block 506. At block 506, method 500 may output the determined pivoted position of pivoting capacitive touch sense assembly 100 to provide a user input.

As described earlier, in various remote control embodiments, outputting of the determined pivoted position of pivoting capacitive touch sense assembly 100 may include transmission of signals encoded with the pivoted position to a media consumption device controlled by the remote controller.

Accordingly, a pivoting capacitive touch sense assembly 100 capable of facilitating touch sense user input that can provide tactile feedback has been described.

In summary, various example embodiments of the present disclosure have been described including, but are not limited to:

Example 1, which may be an apparatus for providing user input. The apparatus may include a capacitive touch sense module having a center region and a plurality of arms extending away from the center region in a plurality of directions, including a first arm extending away from the center region in a first direction, and a second arm extending away from the center region in a second direction opposite to the first direction. Additionally, the apparatus may include one or more pairs of springs, including a first pair of springs disposed at respective edges of an under surface of the first and second arms to allow the capacitive touch sense module to pivot between the first and second directions.

Example 2 may be example 1, further comprising a stem extending from a center point of the center region in a direction orthogonal to an under surface of the capacitive touch sense module.

Example 3 may be example 2, further comprising a printed circuit board mated with the capacitive touch sense module, wherein the printed circuit board has a switch, and wherein the stem is configured to activate the switch, when the capacitive touch sense module is pressed towards the printed circuit board.

Example 4 may be any one of examples 1-3, wherein the apparatus comprises a remote control, wherein the first and second arms are configured to pivot between the first and second directions to increase or decrease a volume of a media consumption device controlled by the remote control.

Example 5 may be any one of examples 1-4, wherein the apparatus comprises a remote control, wherein the first and second arms are configured to pivot between the first and second directions to move up or move down a current channel of a media consumption device controlled by the remote control.

Example 6 may be any one of examples 1-5, wherein the capacitive touch sense module is cross shaped, wherein the plurality of arms further includes a third arm extending away from the center region in a third direction orthogonal to the first and second directions, and a fourth arm extending away from the center region in a fourth direction opposite to the third direction, and wherein the one or more pairs of springs further include a second pair of springs disposed at respective edges of an under surface of the third and fourth arms to allow the capacitive touch sense module to pivot between the third and fourth directions.

Example 7 may be example 6, wherein the apparatus comprises a remote control, wherein the first and second arms are configured to pivot between the first and second directions to increase or decrease a volume of a media consumption device controlled by the remote control, and wherein the third and fourth arms are configured to pivot between the third and fourth directions to move up or move down a current channel of a media consumption device controlled by the remote control.

Example 8 may be example 6, further comprising a plurality of snaps, including a first snap, a second snap, a third snap, and a fourth snap, wherein the first, second, third and fourth snaps are respectively disposed at a first corner where the first arm meets the third arm, a second corner where the first arm meets the fourth arm, a third corner where the second arm meets the third arm, and a fourth corner where the second arm meets the fourth arm.

Example 9 may be example 8, wherein the plurality of snaps are configured to mechanically attach the apparatus to a printed circuit board.

Example 10 may be any one of examples 1-9, further comprising a plurality of bonding pads disposed around a perimeter of the center region.

Example 11 may be example 10, wherein the plurality of bonding pads are configured to electrically attach the apparatus to a printed circuit board.

Example 12 may be any one of examples 1-11, further comprising a transmitter coupled to the capacitive touch sense module, and configured to transmit a pivoted position of the capacitive touch sense module to a receiving device.

Example 13 may be an apparatus for providing user input. The apparatus may include means for receiving a signal indicative of a pivoting capacitive touch sense module having been pressed; and means for determining, in response to receipt of the signal, a pivoted position of the pivoting capacitive touch sense module. Additionally, the apparatus may include means for outputting, on determination of the pivoted position, the pivoted position.

Example 14 may be example 13, wherein the apparatus comprises a remote control, and wherein means for outputting the pivoted position comprises means for transmitting the pivoted position to a media consumption device controlled by the remote control.

Example 15 may be example 13 or 14, wherein the apparatus comprises a remote control, and the pivoted position denotes an increase or decrease of a volume of a media consumption device controlled by the remote control.

Example 16 may be any one of examples 13-15, wherein the apparatus comprises a remote control, and the pivoted position denotes a user command to move up or move down a current channel of a media consumption device controlled by the remote control.

Example 17 may be any one of examples 13-16, further comprising the pivoting capacitive touch sense module.

Example 18 may be a method for providing user input. The method may include receiving a signal indicative of a pivoting capacitive touch sense module of a user input device having been pressed; and in response to receipt of the signal, determining a pivoted position of the pivoting capacitive touch sense module. The method may further include on determination of the pivoted position, outputting the pivoted position.

Example 19 may be example 18, wherein the apparatus comprises a remote control, and wherein outputting comprises transmitting the pivoted position to a media consumption device controlled by the remote control.

Example 20 may be example 18 or 19, wherein the apparatus comprises a remote control, and the pivoted position denotes an increase or decrease of a volume of a media consumption device controlled by the remote control.

Example 21 may be any one of examples 18-20, wherein the apparatus comprises a remote control, and the pivoted position denotes a user command to move up or move down a current channel of a media consumption device controlled by the remote control.

Example 22 may be one or more storage medium comprising a plurality of instructions configured to cause an apparatus, in response to execution of the instruction by the apparatus, to receive a signal indicative of a pivoting capacitive touch sense module of the apparatus having been pressed; and in response to receipt of the signal, determine a pivoted position of the pivoting capacitive touch sense module. The apparatus may be further caused to, on determination of the pivoted position, output the pivoted position.

Example 23 may be example 22, wherein the apparatus comprises a remote control, and wherein output the pivoted position comprises transmission of the pivoted position to a media consumption device controlled by the remote control.

Example 24 may be example 22 or 23, wherein the apparatus comprises a remote control, and the pivoted position denotes an increase or decrease of a volume of a media consumption device controlled by the remote control.

Example 25 may be any one of examples 22-24, wherein the apparatus comprises a remote control, and the pivoted position denotes a user command to move up or move down a current channel of a media consumption device controlled by the remote control.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the examples.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. An apparatus comprising:
    a sensor module configured to detect a user input, the sensor module including a center region and a plurality of arms extending away from the center region in a plurality of directions, the plurality of arms including a first arm extending laterally from the center region in a first direction, and a second arm extending laterally from the center region in a second direction that is opposite to the first direction, wherein each of the plurality of arms includes an interior edge that connects to the center region and an exterior distal edge; and
    a spring module mounted on an undersurface of the sensor module and configured to allow the sensor module to pivot in the first direction when the user input is applied to the first arm and in the second direction when the user input is applied to the second arm, wherein the spring module includes:
        a center spring portion that is positioned proximate to but does not contact the center region, and
        one or more pairs of flat springs, the one or more pairs of flat springs including a first pair of flat springs, wherein the first pair of flat springs includes:
            a first flat spring that extends between the center spring portion and the exterior edge of the first arm, and
            a second flat spring that extends between the center spring portion and the exterior edge of the second arm.

2. The apparatus of claim 1, further comprising:
    a stem extending from the center region in a direction orthogonal to the undersurface of the sensor module.

3. The apparatus of claim 2, wherein the stem is configured to move, when the user input is applied to the center region, through an opening in the center spring portion to activate a switch on a printed circuit board coupled to the sensor module.

4. The apparatus of claim 1, wherein the apparatus comprises a remote control, and wherein the first and second arms are configured to pivot between the first and second directions to modify a volume of a media consumption device controlled by the remote control.

5. The apparatus of claim 1, wherein the apparatus comprises a remote control, and wherein the first and second arms are configured to pivot between the first and second directions to change a channel presented by a media consumption device controlled by the remote control.

6. The apparatus of claim 1, wherein the plurality of arms further includes a third arm extending away from the center region in a third direction orthogonal to the first and second directions and a fourth arm extending away from the center region in a fourth direction opposite to the third direction, wherein the spring module is further configured to allow the sensor module to pivot in the third direction when the user input is applied to the third arm or in the fourth direction when the user input is applied to the fourth arm, and wherein the one or more pairs of flat springs further include a second pair of flat springs, the second pair of flat springs including:
    a third flat spring that extends between the center spring portion and the exterior edge of the third arm, and
    a fourth flat spring that extends between the center spring portion and the exterior edge of the fourth arm.

7. The apparatus of claim 6, wherein the apparatus comprises a remote control, wherein the first and second arms are configured to pivot between the first and second directions to modify a volume of a media consumption device controlled by the remote control, and wherein the third and fourth arms are configured to pivot between the third and fourth directions to change a channel presented by the media consumption device.

8. The apparatus of claim 6, further comprising a plurality of snaps, the plurality of snaps including a first snap, a second snap, a third snap, and a fourth snap, wherein the first, second, third and fourth snaps are respectively disposed at a first corner where the first arm meets the third arm, a second corner where the first arm meets the fourth arm, a third corner where the second arm meets the third arm, and a fourth corner where the second arm meets the fourth arm.

9. The apparatus of claim 8, wherein the plurality of snaps are configured to mechanically attach the apparatus to a printed circuit board.

10. The apparatus of claim 1, further comprising a plurality of bonding pads disposed around the center spring portion.

11. The apparatus of claim 10, wherein the plurality of bonding pads are configured to electrically connect the apparatus to a printed circuit board.

12. The apparatus of claim 1, further comprising a transmitter, wherein the transmitter is configured to transmit, to a receiving device, information identifying when the sensor module is pivoted in one of the first direction or the second direction.

13. An apparatus comprising:
    a touch sensor configured to detect a user input, wherein the touch sensor includes a plurality of arm regions extending away from a center region in a plurality of directions, the plurality of arm regions including a first arm region extending laterally from the center region in a first direction, and a second arm region extending laterally from the center region in a second direction that is opposite to the first direction;

a spring module mounted on an undersurface of the touch sensor and configured to enable the touch sensor to move in the first direction when the user input is applied to the first arm region and in the second direction when the user input is applied to the second arm region, wherein the spring module includes a first spring that extends between a center spring portion to an exterior edge of the first arm region, and a second spring that extends between the center spring portion and an exterior edge of the second arm region; and a processor configured to:
  detect when the touch sensor is moved in one of the first direction or the second direction; and
  output a first control signal associated with the one of the first direction or the second direction.

14. The apparatus of claim 13, further comprising:
a stem extending from the undersurface of the touch sensor, wherein the stem is configured to move through an opening in the center spring portion to contact a sensor when the user input is applied to the center region,
wherein the processor is further configured to:
  detect when the stem contacts the sensor, and
  output a second control signal associated with the user input being applied to the center region.

15. The apparatus of claim 13, wherein the first control signal relates to modifying a volume of a media consumption device.

16. The apparatus of claim 13, the first control signal relates to changing a channel presented by a media consumption device.

17. The apparatus of claim 13, wherein the plurality of arm regions further includes a third arm region extending away from the center region in a third direction orthogonal to the first and second directions and a fourth arm region extending away from the center region in a fourth direction opposite to the third direction, wherein the spring module is further configured to allow the touch sensor to move in the third direction when the user input is applied to the third arm region and in the fourth direction when the user input is applied to the fourth arm region, wherein the spring module further includes a third spring that extends between the center spring portion and an exterior edge of the third arm region and a fourth spring that extends between the center spring portion and an exterior edge of the fourth arm, and
wherein the processor is further configured to:
  detect when the touch sensor is moved in one of the third direction or the fourth direction; and
  output a second control signal associated with the one of the third direction or the fourth direction.

18. The apparatus of claim 17, wherein the first control signal relates to modifying a volume of a media consumption device, and the second control signal relates to modifying a channel presented by the media consumption device.

19. The apparatus of claim 13, further comprising:
a printed circuit board on which the processor is mounted; and
a plurality of snaps configured to mechanically couple the touch sensor to a printed circuit board.

20. The apparatus of claim 13, further comprising a plurality of bonding pads connected to the spring module, the plurality of bonding pads being configured to provide an electrical path between the touch sensor and the processor.

* * * * *